(12) United States Patent
Lee

(10) Patent No.: US 10,224,366 B2
(45) Date of Patent: Mar. 5, 2019

(54) VEHICLE LAMP USING SEMICONDUCTOR LIGHT EMITTING DEVICE FORMING TRIANGULAR ARRAYS

(71) Applicant: LG ELECTRONICS INC., Seoul (KR)

(72) Inventor: Sungwhan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/594,067

(22) Filed: May 12, 2017

(65) Prior Publication Data

US 2018/0331152 A1  Nov. 15, 2018

(51) Int. Cl.
| | |
|---|---|
| *H01L 27/15* | (2006.01) |
| *H01L 33/62* | (2010.01) |
| *H01L 33/20* | (2010.01) |
| *B60Q 1/30* | (2006.01) |
| *B60Q 1/26* | (2006.01) |
| *F21S 43/14* | (2018.01) |
| *F21S 43/19* | (2018.01) |

(52) U.S. Cl.
CPC .......... *H01L 27/156* (2013.01); *B60Q 1/2696* (2013.01); *B60Q 1/30* (2013.01); *F21S 43/14* (2018.01); *F21S 43/195* (2018.01); *H01L 33/20* (2013.01); *H01L 33/62* (2013.01)

(58) Field of Classification Search
CPC ... F21Y 2105/14; F21Y 2105/12; H01L 33/20
See application file for complete search history.

(56) References Cited

U.S. PATENT DOCUMENTS

| 7,316,486 B2* | 1/2008 | Klettke | B60Q 3/43 |
| | | | 362/231 |
| 7,993,022 B2* | 8/2011 | Bertram | G02F 1/133603 |
| | | | 362/231 |
| 2015/0091787 A1* | 4/2015 | Ohmae | F21K 9/00 |
| | | | 345/83 |

* cited by examiner

*Primary Examiner* — Robert J May
(74) *Attorney, Agent, or Firm* — Birch, Stewart, Kolasch & Birch, LLP

(57) ABSTRACT

The present invention relates to a vehicle lamp, and more particularly, a vehicle lamp using a semiconductor light emitting device. The vehicle lamp according to the present invention includes a light source unit, and the light source unit includes a wiring board, and a plurality of semiconductor light emitting devices electrically connected to the wiring board and arranged along a plurality of rows, wherein the plurality of semiconductor light emitting devices include first semiconductor light emitting devices arranged at preset intervals along a first row of the plurality of rows, and second semiconductor light emitting devices arranged at the preset intervals along a second row neighboring to the first row, and wherein each of the second semiconductor light emitting devices is disposed between neighboring first semiconductor light emitting devices of the first semiconductor light emitting devices so as to form triangular arrays with the first semiconductor light emitting devices.

14 Claims, 9 Drawing Sheets

(a)

(b)

(c)

(d)

VEHICLE LAMP USING SEMICONDUCTOR LIGHT EMITTING DEVICE FORMING TRIANGULAR ARRAYS

BACKGROUND OF THE INVENTION

1. Field of the Invention

This specification relates to a vehicle lamp (or car lamp), and more particularly, a vehicle lamp using a semiconductor light emitting device.

2. Background of the Invention

A vehicle is equipped with various lamps having lighting functions and signaling functions. In general, halogen lamps or gas discharge lamps are usually used, but in recent years, light emitting diodes (LEDs) are in the spotlight as light sources for vehicle lamps.

The LED can enhance a degree of freedom for design of a lamp by minimizing a size thereof and exhibit economical efficiency by virtue of a semi-permanent lifespan, but most of the LEDs are currently produced in a form of a package. The LED itself other than the package is under development as a semiconductor light emitting device of converting a current into light. And the LED itself other than the package is under development as an image displaying light source equipped in an electronic device such as an information communication device.

Vehicle lamps ever developed use the LEDs in the package form and thereby have disadvantages, such as a low mass production yield rate, high fabrication costs and low flexibility.

Therefore, attempts to apply a surface light source fabricated using the semiconductor light emitting device itself other than the package type to the vehicle lamp are currently undergoing.

Meanwhile, the vehicle lamp may have various shapes and also the attempt to apply the surface light source to the vehicle lamp having the various shapes is actively made.

SUMMARY OF THE INVENTION

Therefore, an aspect of the detailed description is to provide a vehicle lamp (or car lamp) which uses a surface light source configured as a semiconductor light emitting device and has various shapes.

In addition, another aspect of the detailed description is to provide a surface light source structure capable of improving brightness of edges of a vehicle lamp having various shapes.

To achieve these and other advantages and in accordance with the purpose of this specification, as embodied and broadly described herein, a vehicle lamp according to the present invention proposes a method of changing an arrangement structure of semiconductor light emitting devices. In more detail, a vehicle lamp according to the present invention may include a light source unit to emit light. The light source unit may include a wiring board, and a plurality of semiconductor light emitting devices electrically connected to the wiring board and arranged along a plurality of rows. The plurality of semiconductor light emitting devices may include first semiconductor light emitting devices arranged at preset intervals along a first row of the plurality of rows, and second semiconductor light emitting devices arranged at the preset intervals along a second row neighboring to the first row. Each of the second semiconductor light emitting devices may be disposed between neighboring first semiconductor light emitting devices of the first semiconductor light emitting devices so as to form triangular arrays with the first semiconductor light emitting devices.

In an embodiment disclosed herein, an interval between the first semiconductor light emitting devices arranged along the first row and the second semiconductor light emitting devices arranged along the second row may be the same as the preset interval.

In an embodiment disclosed herein, the first semiconductor light emitting devices arranged along the first row may be dislocated with respect to the second semiconductor light emitting devices arranged along the second row, in a column direction perpendicular to a row direction.

In an embodiment disclosed herein, the light source unit may be divided into a plurality of triangular regions by the triangular arrays.

In an embodiment disclosed herein, the plurality of semiconductor light emitting devices may be arranged on vertexes of the triangular regions, respectively.

In an embodiment disclosed herein, at least some of the triangular regions may form a edge of the light source unit.

In an embodiment disclosed herein, the triangular regions may sequentially form a triangular shape and an inverted triangular shape along a row direction.

In an embodiment disclosed herein, an edge of the wiring board may be inclined in at least one of a row direction and a column direction perpendicular to the row direction.

In an embodiment disclosed herein, at least some of the plurality of semiconductor light emitting devices may be sequentially arranged at the preset interval along the inclined edge of the wiring board.

In an embodiment disclosed herein, one side forming the edge of the wiring board may form an acute angle or an obtuse angle with another neighboring side.

In an embodiment disclosed herein, the light source unit may be formed in a manner that at least part of an edge thereof is curved.

In an embodiment disclosed herein, the plurality of semiconductor light emitting devices may be arranged such that an arranged interval in one of the row direction and the column direction is greater than an interval in another direction.

In an embodiment disclosed herein, each of the plurality of semiconductor light emitting devices may include a light emitting region in a rectangular shape, and a length of one side of the light emitting region may be longer than a length of another side by $3/2\sqrt{3}\pm0.5$ times.

In an embodiment disclosed herein, a length of the light emitting region in a column direction may be longer than a length in a row direction.

In an embodiment disclosed herein, each of the plurality of semiconductor light emitting devices may include an n-type semiconductor layer, an active layer and a p-type semiconductor layer sequentially stacked one another, and the light emitting region may correspond to an area of the active layer.

As described above, in a vehicle lamp (or car lamp) according to the present invention, semiconductor light emitting devices can be arranged in a manner that semiconductor light emitting devices arranged in neighboring rows form triangular arrays, thereby placing more semiconductor light emitting devices on an edge region of the vehicle lamp having various shapes. Therefore, brightness of the edge region of the vehicle lamp can be more improved.

In addition, in the vehicle lamp according to the present invention, light emitted from the semiconductor light emitting devices arranged in the triangular arrays can uniformly be spread in all directions by proposing a ratio of length or width of the semiconductor light emitting devices optimized for the triangle array.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that when an element such as a layer, area or substrate is referred to as being "on" another element, it can be directly on the element, or one or more intervening elements may also be present.

A vehicle lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the embodiments described herein may also be applied to a new product type that will be developed later if the device is a device capable of emitting light.

Figure 1A:
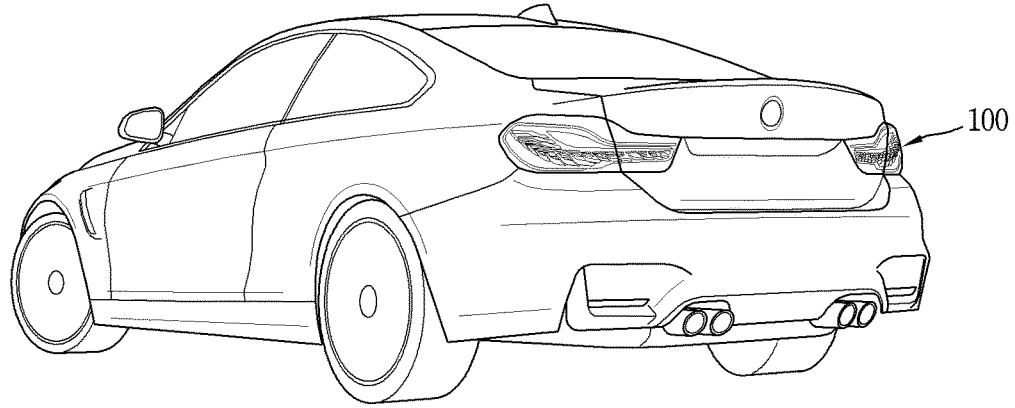
FIG. 1A is a conceptual view illustrating a rear lamp as one embodiment of a vehicle lamp.
Figure 1B:
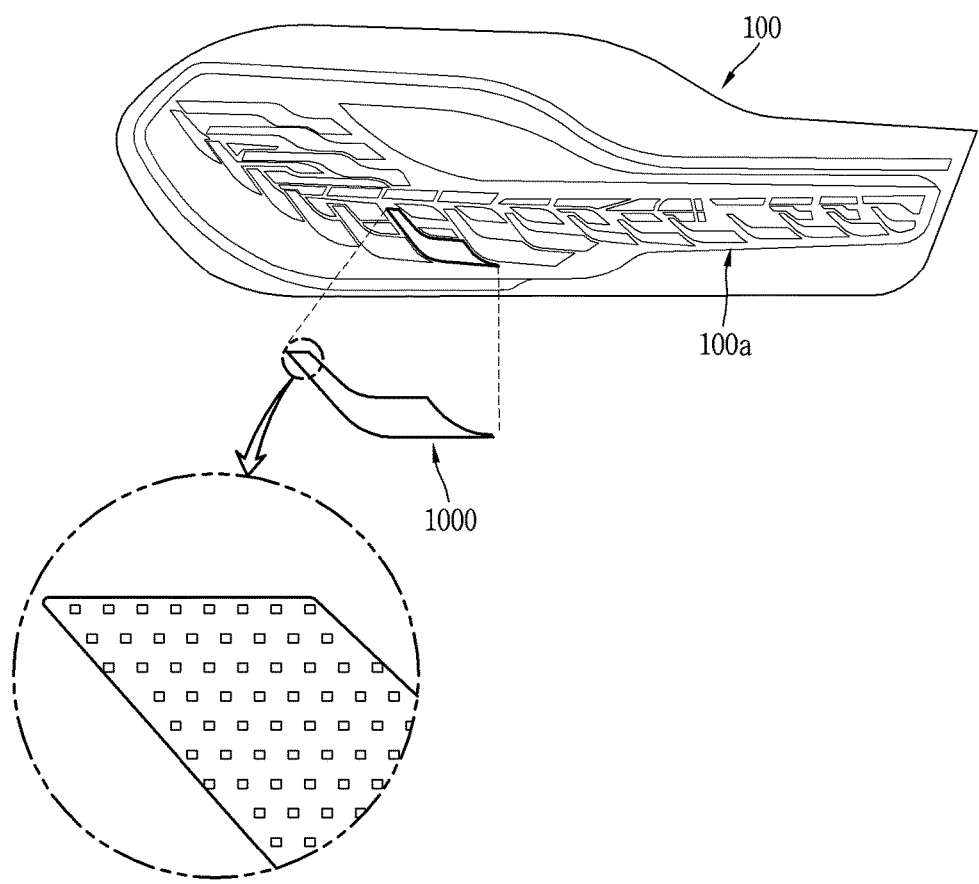
FIG. 1B is an enlarged view illustrating a state that the rear lamp of FIG. 1A is turned on; with the present invention.

FIG. 1A is a conceptual view illustrating a rear lamp as one embodiment of a vehicle lamp, and FIG. 1B is an enlarged view illustrating a state in which the rear lamp of FIG. 1A is turned on.

Referring to FIG. 1A, a rear lamp 100 of a vehicle is disposed on each of both sides of a rear surface of the vehicle, thereby forming rear appearance of the vehicle.

The rear lamp 100 may be a lamp in which a tail lamp, a turn signal lamp, a brake lamp, an emergency lamp, and a backup lamp are combined in a package form. That is, the rear lamp 100 includes a plurality of lamps selectively emitting light according to the control of the vehicle.

In this instance, at least one of the plurality of lamps may be configured to emit light in a preset shape. As one example, a brake lamp 100a may be formed long in a horizontal direction and have at least part curved in a vertical direction, such that light is emitted in a shape corresponding to the shape of the brake lamp 100a. In addition, the brake lamp 100a may be bent toward the front of the vehicle. Such three-dimensional complex shape may be realized by a plurality of light emitting regions.

Referring to FIG. 1B, the preset shape is realized by combining light emitting regions with different shapes.

A light source unit 1000 implemented by a semiconductor light emitting device may be disposed on the light emitting region. The light source unit 1000 may be fixed to a vehicle body through a frame, and a wiring line for supplying power to the light source unit 1000 may be connected to the frame.

The light source unit may be a flexible light source unit that can be curved, bent, twisted, folded or rolled by an external force. The light source unit may also be a surface light source having a light emitting surface corresponding to the light emitting region.

In this instance, the light source unit 1000 may be provided in plurality to be arranged on the light emitting regions, respectively, or be configured as a single light emitting unit so as to realize the entire preset shape.

A pixel of the light source unit 1000 may be implemented by a semiconductor light emitting device. In the present invention, a light emitting diode (LED) is exemplarily employed as one type of semiconductor light emitting device for converting a current into light. The LED may be a light emitting device having a size ranging from several to several tens of micrometers, and may serve as a pixel on the three-dimensional space.

More specifically, the light source unit according to the present invention may include a wiring board, and a plurality of semiconductor light emitting devices electrically connected to the wiring board and arranged along a plurality of rows.

The plurality of semiconductor light emitting devices provided in the light source unit according to the present invention may include first semiconductor light emitting devices arranged at preset intervals along a first row of the plurality of rows and second semiconductor light emitting devices arranged at the preset intervals along a second row neighboring to the first row. In addition, each of the second semiconductor light emitting devices may be arranged between neighboring first semiconductor light emitting devices, respectively, thereby forming triangular arrays with the first semiconductor light emitting devices. Accordingly, more semiconductor light emitting elements can be placed on an edge region of the vehicle lamp having the various shapes.

In this specification, the first and second semiconductor light emitting devices 1050a and 1050b are named in a distinguishing manner for convenience of explanation, and they are all the same semiconductor light emitting devices in structure and shape.

Figure 2A:
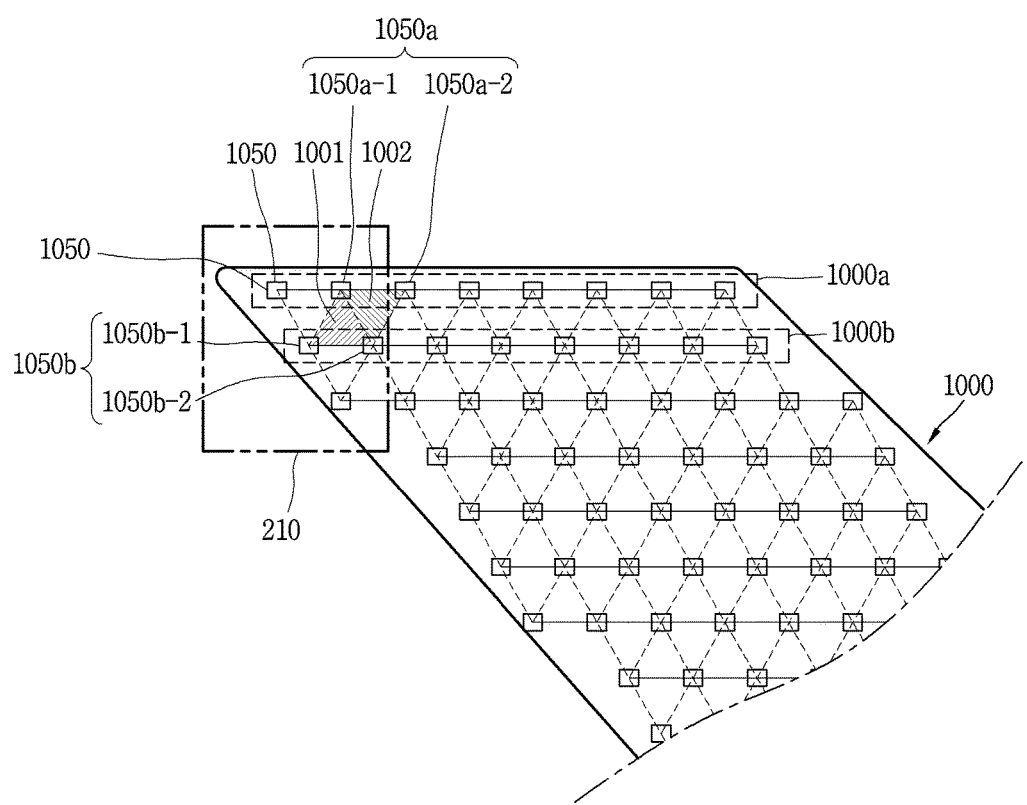
FIG. 2B is a conceptual view illustrating a light source unit according to the related art.
Figure 2B:
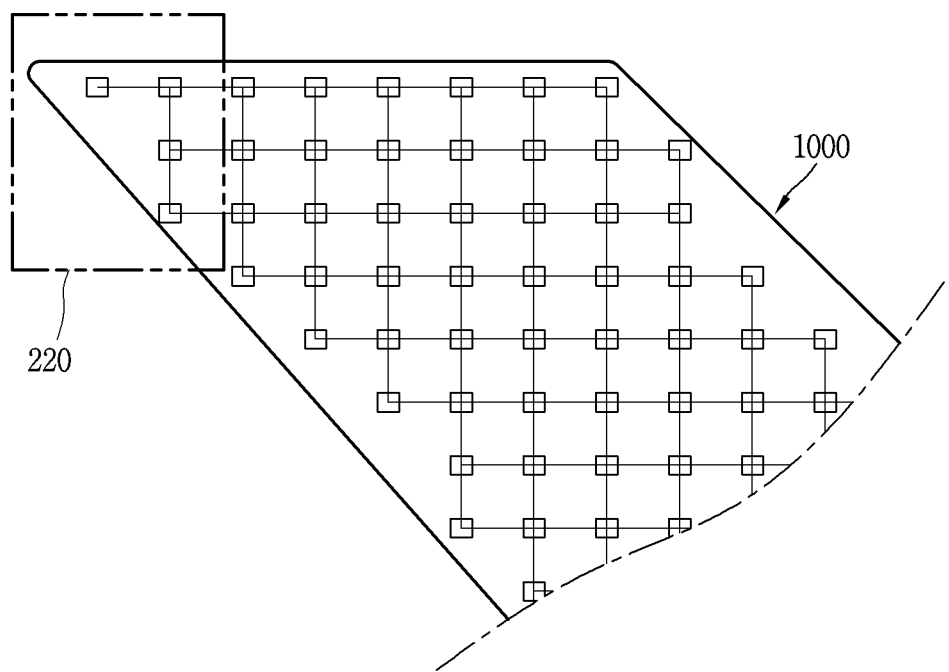
Figure 3A:
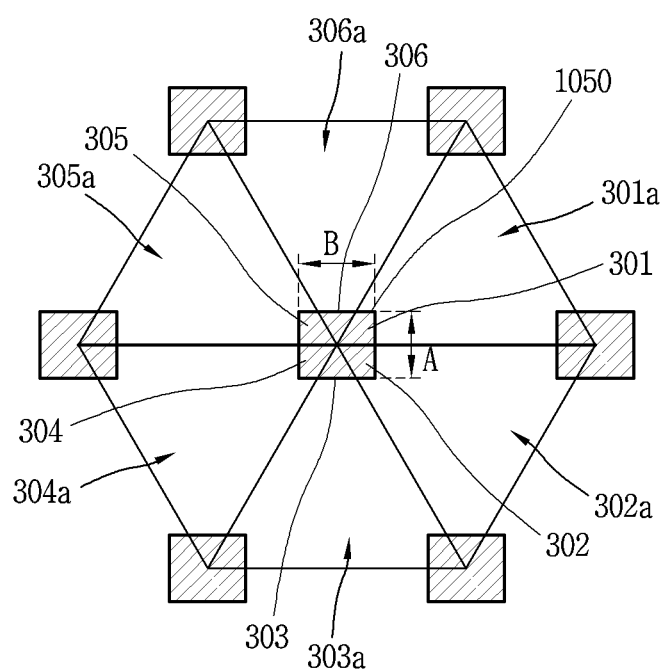
FIGS. 3A and 3B are a conceptual view illustrating a light emitting area of the light source unit according to the present invention.
Figure 3B:
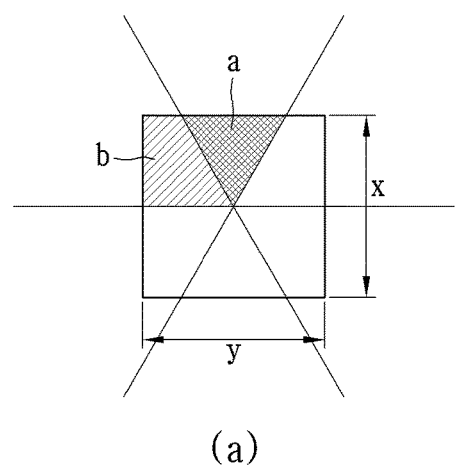
Figure 3B:
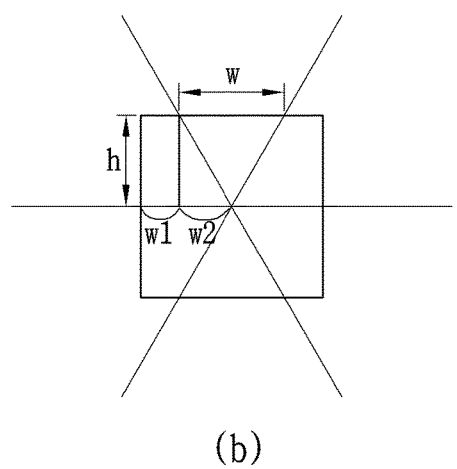
Figure 3B:
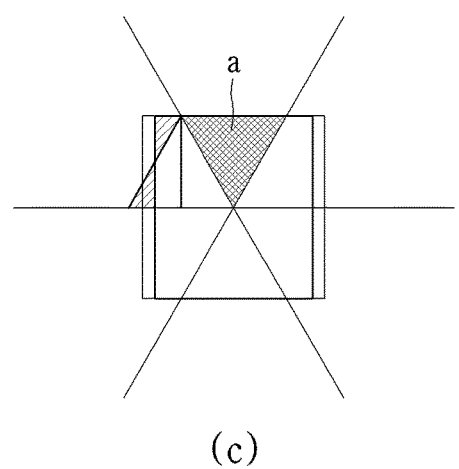
Figure 3B:
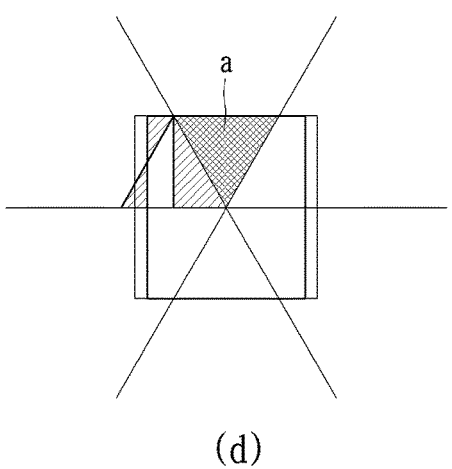
Figure 4:
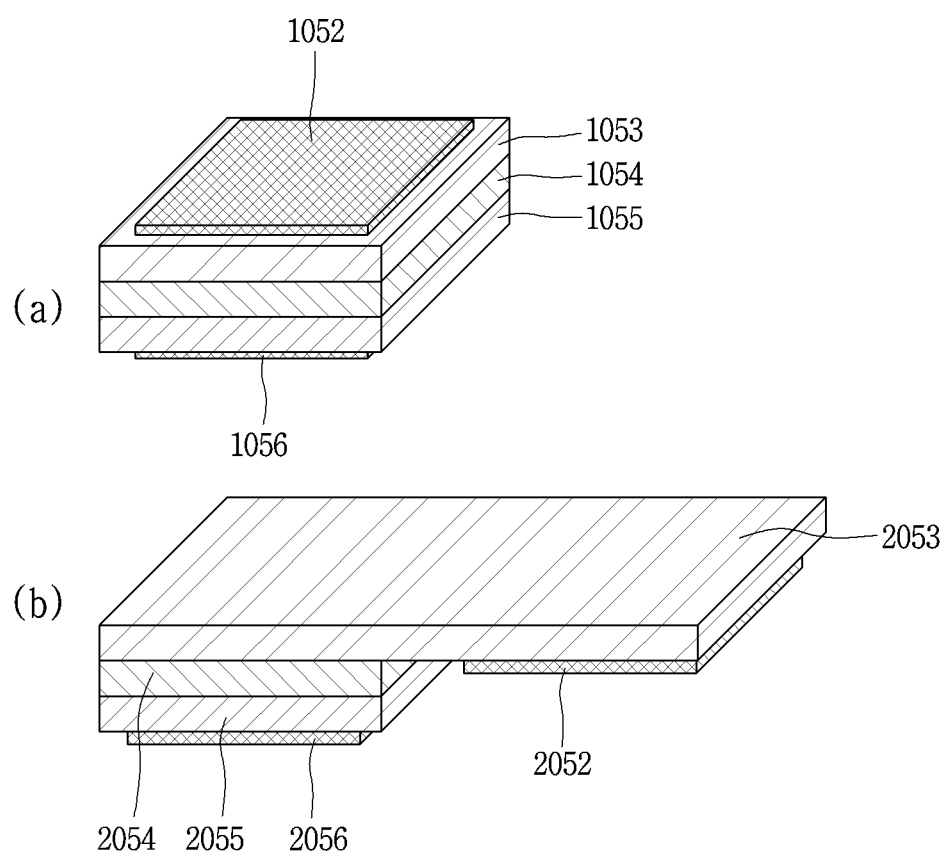
FIG. 4 is a conceptual view illustrating a semiconductor light emitting device provided in a light source unit according to the present invention.
Figure 5A:
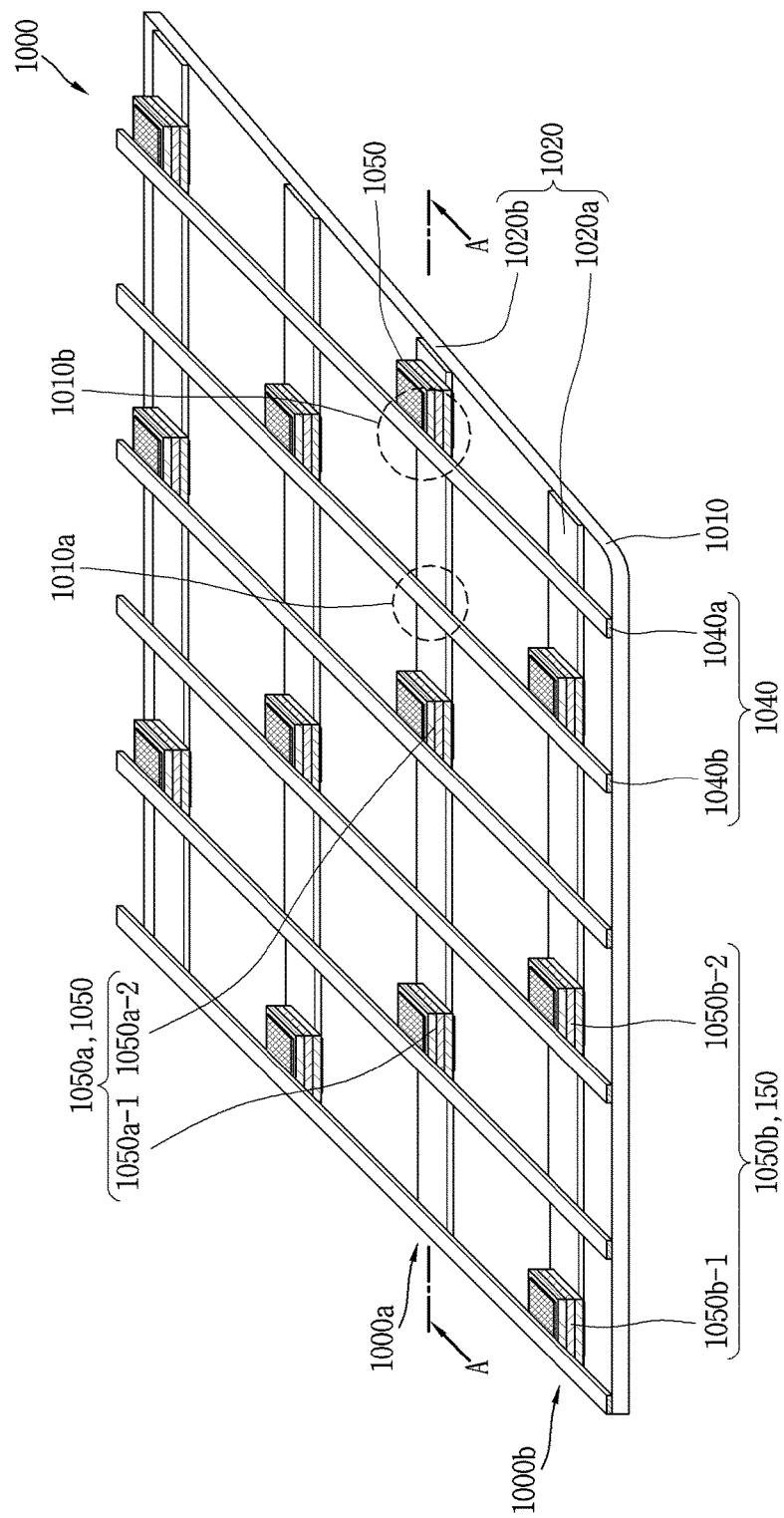
FIGS. 5A and 5B are conceptual views illustrating a structure of a light source unit according to the present invention.
Figure 5B:
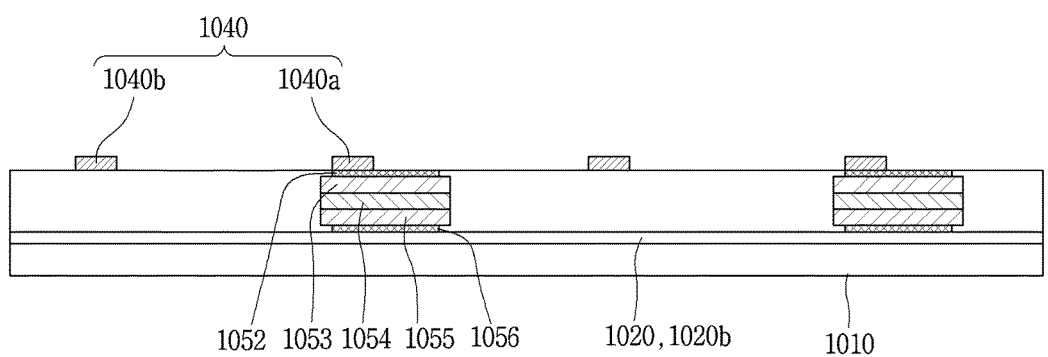

Hereinafter, the light source unit having the semiconductor light emitting devices forming the triangular array will be described in more detail with reference to the accompanying drawings. FIG. 2A is a conceptual view illustrating a light source unit in accordance with the present invention, FIG. 2B is a conceptual view illustrating a light source unit according to the related art, FIGS. 3A and 3B are a conceptual view illustrating a light emitting region of the light source unit according to the present invention, FIG. 4 is a conceptual view illustrating a semiconductor light emitting device provided in the light source unit according to the present invention, and FIGS. 5A and 5B are conceptual views illustrating a structure of the light source unit according to the present invention.

As illustrated in FIG. 2A, a light source unit is provided with a plurality of semiconductor light emitting devices that are arranged at preset intervals in a spacing manner along a plurality of rows 1000a and 1000b.

In more detail, first semiconductor light emitting devices 1050a are arranged along a first row 1000a, and second semiconductor light emitting devices 1050b are arranged along a second row 1000b. The first semiconductor light emitting devices 1050a and the second semiconductor light emitting devices 1050b are spaced apart from each other by the preset interval.

Meanwhile, each of the second semiconductor light emitting devices 1050b (e.g., 1050b-1, 1050b-2) arranged along the second row 1000b is arranged between the neighboring first semiconductor light emitting devices 1050a (e.g., 1050a-1) arranged along the first row 1000a.

Accordingly, the second semiconductor light emitting devices 1050b-1 and 1050b-2 and the neighboring first semiconductor light emitting devices 1050a-1 may form the triangular arrays.

In other words, the first semiconductor light emitting devices 1050a arranged along the first row 1000a may be dislocated with respect to the second semiconductor light emitting devices 1050b arranged along the second row 1000b, in a column direction perpendicular to the row direction.

As illustrated, at least two second semiconductor light emitting devices 1050b-1 and 1050b-2 arranged on the second row 1000b and one neighboring first semiconductor light emitting device 1050a-1 arranged on the first row 1000a may form the triangular array. Accordingly, a triangular region 1001 is defined.

Similarly, at least two first semiconductor light emitting devices 1050a-1 and 1050a-2 arranged on the first row 1000a and one neighboring second semiconductor light emitting device 1050b-2 arranged on the second row 1000b may form the triangular array. Accordingly, a triangular region 1002 is defined.

As such, the light source unit may be divided into the plurality of triangular regions 1001 and 1002 by the triangular arrays formed by the first and second semiconductor light emitting devices 1050a and 1050b. As illustrated, the triangular regions may sequentially form a triangular shape and an inverted triangular shape along the row direction.

Meanwhile, the interval between the first semiconductor light emitting devices 1050a arranged along the first row 1000a and the second semiconductor light emitting devices 1050b arranged along the second row 1000b may be the same as an interval between the neighboring first semiconductor light emitting devices 1050a in the first row 1000a.

Similarly, the interval between the first semiconductor light emitting devices 1050a arranged along the first row 1000a and the second semiconductor light emitting devices 1050b arranged along the second row 1000b may be the same as an interval between the neighboring second semiconductor light emitting devices 1050b in the second row 1000b.

That is, the interval between the neighboring first semiconductor light emitting devices 1050a, the interval between the neighboring second semiconductor light emitting devices 1050b, and the interval between the first and second semiconductor light emitting devices 1050a and 1050b may all be the same. Thus, the triangular array and the triangular region may correspond to a regular triangle.

In addition, the plurality of semiconductor light emitting devices 1050, as illustrated, may be arranged on vertexes of the triangular regions, respectively. At least some of the triangular regions may form the edge of the light source unit.

As described above, when the plurality of semiconductor light emitting devices 1050 are arranged to form the triangular arrays, more semiconductor light emitting devices can be arranged on the edge portion of the light source unit 1000 having various shapes, thereby enhancing brightness of the edge portion of the light source unit 1000.

As illustrated, the light source unit 1000 may have various shapes. For example, the light source unit 1000 may be configured in a shape that one side is inclined with respect to another side, at least part protrudes, at least part is recessed, or at least one side is curved. Therefore, a portion of the light source unit 1000 at which a width is more narrowed or widened than that of another portion may be formed at the edge portion of the light source unit 1000.

Therefore, when the width of the light source unit 1000 changes, in order to place more semiconductor light emitting devices at the edge of the light source unit 1000, the semiconductor light emitting devices may be arranged in the is triangular array as illustrated in FIG. 2A, rather than a rectangular array as illustrated in FIG. 2B.

As illustrated in FIG. 2A, at least some of the plurality of semiconductor light emitting devices forming the triangular array may sequentially be arranged at preset intervals along an inclined edge of the light source unit.

Comparing to this, as illustrated in FIG. 2B, for semiconductor light emitting devices which are arranged at the preset intervals in the rectangular array, less semiconductor light emitting devices than those illustrated in FIG. 2A are arranged along the inclined edge of the light source unit.

In more detail, as illustrated in FIG. 2A, for the triangular array, five semiconductor light emitting devices may be arranged on one edge region 210 of the light source unit. On the other hand, as illustrated in FIG. 2B, for the rectangular array, four semiconductor light emitting devices may be arranged on one edge region 220 of the light source unit. Specifically, for the rectangular array, one less semiconductor light emitting devices is arranged on the edge portion of the light source unit.

Also, as illustrated in FIG. 2B, when a design shape in a curved form is applied after arranging the semiconductor light emitting devices into the square array, the semiconductor light emitting devices arranged at a curved or inclined edge portion may be lost due to being cut off. In this case, a number of semiconductor light emitting devices arranged at the edge portion is smaller than a number of semiconductor light emitting devices arranged at a central portion. This may cause brightness of the edge portion to be lower than brightness of the central portion (e.g., for the rectangular array, the edge portion and the central portion have 25 to 50% of brightness deviation).

However, as illustrated in FIG. 2A, when the semiconductor light emitting devices are arranged into the triangular array, less semiconductor light emitting devices may be cut off at the curved or inclined edge portion, compared with the rectangular array illustrated in FIG. 2B.

That is, the semiconductor light emitting devices forming the triangular array may be more arranged at the curved or inclined edge portion, than the semiconductor light emitting devices forming the rectangular array. Therefore, in this instance, the brightness deviation between the edge portion and the central portion can be more reduced than that in the rectangular array (e.g., for the triangular array, the edge portion and the central portion have about 66.6% of brightness deviation).

Therefore, for the triangular array, more semiconductor light emitting devices can be arranged along the edge of the light source unit, which may result in improving brightness of the edge of the light source unit having various shapes. Also, in this instance, since the semiconductor light emitting devices are also arranged on the edge of the light source unit as many as possible, non-uniform brightness between the edge portion and a central portion of the light source unit can be overcome.

As aforementioned, the light source unit equipped in the rear lamp for the vehicle according to the present invention includes the plurality of semiconductor light emitting devices arranged in the triangular array.

As illustrated in the present invention, when the plurality of semiconductor light emitting devices are arranged in the triangular array, as illustrated in FIG. 3B, one semiconductor light emitting device 1050 emits light to each of six triangular regions 301a, 302a, 303a, 304a, 305a and 306a.

The one semiconductor light emitting device 1050 is divided into six light emitting regions 301, 302, 303, 304, 305 and 306, and the light emitting regions 301, 302, 303, 304, 305 and 306 are included in the different triangular regions 301a, 302a, 303a, 304a, 305a and 306a, respectively.

As such, according to the present invention, since one semiconductor light emitting device is divided into the six light emitting regions, each light emitting region should have the same size, in order to implement the rear lamp having uniform brightness.

The semiconductor light emitting device 1050 according to the present invention may include a rectangular light emitting region, and a length A of one side of the rectangular light emitting region may be longer than a length of another neighboring side by $3/2\sqrt{3}\pm0.5$ times.

In more detail, as illustrated in FIG. 3B, a relationship between x (horizontal length of a rectangle) and y (vertical length of the rectangle) that allows a region (a) and a region (b) to have the same area may be defined as follows.

First, using (a) and (b) of FIG. 3B, x and y may be defined as lengths of sides and height, as illustrated below.

$$x=2\times(w1+w2)$$

$$y=2\times h$$

(where w1 denotes a length of a top side of b, and w2 denotes a bottom side of b, and h denotes a height of b.)

In this instance, referring to (c) of FIG. 3B and (d) of FIG. 3B, a regular triangle with h/2 as a height and 2w1 as each side and a regular triangle with h as a height and 2w2 as each side may be set.

In detail, as illustrated in (c) of FIG. 3B, if a line is drawn from a vertex of the region (a) to pass through a midpoint of a left side of the region (b), a right triangle with w1 as a bottom side and h/2 as a height is formed. If two of such regular triangles are combined, a regular triangle with w1×2 as a bottom side and h2 as a height is formed.

Also, as illustrated in (d) of FIG. 3B, if a vertical line is drawn from the vertex of the region a toward a bottom line of the region b, a right triangle with w2 as a bottom side and h as a height is formed. Even in this instance, if two of such right triangles are combined, a regular triangle with w2×2 as a bottom line and h as a height is formed.

Therefore, using a height equation of a right triangle, w1 and w2 have the following relationship with h, respectively.

$$\frac{1}{2}\times h = \frac{\sqrt{3}}{2}(w1\times 2), \quad h = \frac{\sqrt{3}}{2}(w2\times 2)$$

$$\frac{1}{2\sqrt{3}}h \qquad \qquad \frac{1}{\sqrt{3}}h$$

Accordingly, w1= and w2=. Also, if these are put into an equation
x=2×(w1+w2) and h is replaced with y, x and y have the following relationship.

$$x = 2\times\left(\frac{1}{2\sqrt{3}}h + \frac{1}{\sqrt{3}}h\right)$$

$$= 2\times\frac{3}{2\sqrt{3}}h$$

$$= 2\times\frac{3}{2\sqrt{3}}\times\frac{1}{2}y \rightarrow x = \frac{3}{2\sqrt{3}}y$$

As such, the semiconductor light emitting devices having such length ratio may allow each of the six divided light emitting regions to have substantially the same area. Meanwhile, the semiconductor light emitting device may be arranged such that a length of the rectangular light emitting region in a row direction is longer than a length thereof in a column direction.

Here, the rectangular light emitting region is a region through which light is actually emitted from the semiconductor light emitting device. In more detail, as illustrated in (a) and (b) of FIG. 4, each of the semiconductor light emitting devices includes an n-type semiconductor layer 1053, 2053, an active layer 1054, 2054 and a p-type semiconductor layer 1055, 2055 which are sequentially stacked. The rectangular light emitting region corresponds to an area of the active layer 1054, 2054.

Meanwhile, the rear lamp according to the present invention may be configured as one of a vertical semiconductor light emitting device as illustrated in (a) of FIG. 4, or a horizontal semiconductor light emitting device as illustrated in (b) of FIG. 4.

In one example, as illustrated in (a) of FIG. 4, the rear lamp according to the present invention may include vertical semiconductor light emitting devices. Each of the vertical semiconductor light emitting devices includes a p-type electrode 1056, a p-type semiconductor layer 1055 with the p-type electrode 1056 disposed thereon, an active layer 1054 disposed on the p-type semiconductor layer 1055, an n-type semiconductor layer 1053 disposed on the active layer 1054, and an n-type electrode 1052 disposed on the n-type semiconductor layer 1053. The p-type electrode 1056 and the n-type electrode 1052 may be electrically connected to electrodes 1020 and 1040 provided on a wiring board illustrated in FIG. 5A.

In addition, the vertical semiconductor light emitting device may be configured such that the active layer 1054 and the n-type and p-type semiconductor layers 1053 and 1055 have the same area. Therefore, in this instance, a length of a horizontal side of the semiconductor light emitting device may correspond to $3/2\sqrt{3} \pm 0.5$ times of a length of a vertical side.

In another example, as illustrated in (b) of FIG. 4, the rear lamp according to the present invention may include the horizontal semiconductor light emitting devices. Each of the horizontal semiconductor light emitting devices includes a p-type electrode 2055, a p-type semiconductor layer 2055 with the p-type electrode 2056 disposed thereon, an active layer 2054 disposed on the p-type semiconductor layer 2055, an n-type semiconductor layer 2053 disposed on the active layer 2054, and an n-type electrode 2052 disposed on the n-type semiconductor layer 2053 with being spaced apart from the p-type electrode 2056 in a horizontal direction. The p-type electrode 2056 and the n-type electrode 2052 may be electrically connected to the electrodes 1020 and 1040 provided on the wiring board illustrated in FIG. 5A.

Meanwhile, the light emitting region of the horizontal semiconductor light emitting device may correspond to an area of the active layer 2054. In this instance, a length of a horizontal side of the active layer 2054 may correspond to $3/2\sqrt{3} \pm 0.5$ times of a length of a vertical side.

As described above, the rear lamp according to the present invention may include one of the horizontal semiconductor light emitting device and the vertical semiconductor light emitting device. Hereinafter, an example of a rear lamp having the vertical semiconductor light emitting device will be described in more detail.

FIGS. 5A and 5B are conceptual views illustrating a structure that semiconductor light emitting devices are arranged on the wiring board.

As illustrated in FIGS. 5A and 5B, the rear lamp for the vehicle according to the present invention may include the light source unit 1000, and the light source unit 1000 may include the wiring board 1010, the plurality of electrodes 1020 and 1040, and the semiconductor light emitting devices 1050.

The wiring board 1010 may be provided thereon with the first electrode 1020 disposed in a row direction, the semiconductor light emitting devices 1050 arranged along the first electrode 1010, and the second electrode 1040 overlapping at least part of the semiconductor light emitting devices 1050 and perpendicularly intersecting with the first electrode 1020.

The semiconductor light emitting devices 1050 may be electrically connected to the first and second electrodes 1020 and 1040 to emit light.

The wiring board 1010, for example, may contain glass or polyimide (PI) for implementing a flexible display device. Also, the wiring board 1010 may use any material, for example, polyethylene naphthalate (PEN), polyethylene terephthalate (PET) and the like, if the material has an insulating property and flexibility. Also, the wiring board 1010 may be made of any of a transparent material or an opaque material.

As discussed above, the light source unit 1000 may have various shapes. In this instance, the wiring board 1010 itself may be configured to have various shapes. For example, although not illustrated, the wiring board 1010 may be configured in a shape that one side is inclined with respect to another side, at least part protrudes, at least part is recessed, or at least one side is curved. Therefore, a portion of the wiring board 1010 at which a width is more narrowed or widened that that of another portion may be formed at an edge portion of the wiring board 1010.

Therefore, the edge of the wiring board 1010 may be inclined with respect to at least one of the row direction and a column direction perpendicular to the row direction.

In this instance, at least some of the plurality of semiconductor light emitting devices may sequentially be arranged at the preset intervals along the inclined edge of the wiring board 1010. In this instance, one side forming the edge of the wiring board 1010 may form an acute angle or an obtuse angle with another neighboring side.

Meanwhile, as discussed above, the semiconductor light emitting devices according to the present invention are arranged in parallel in a direction of the rows 1000a and 1000b, along which first electrodes 1020a and 1020b are arranged, and the semiconductor light emitting devices 1050a-1, 1050a-2, 1050b-1 and 1050b-2 arranged on neighboring rows form the triangular arrays. The first semiconductor light emitting devices 1050a-1 and 1050a-2 arranged along the first row 1000a may be dislocated with respect to the second semiconductor light emitting devices 1050b-1 and 1050b-2 arranged along the second row 1000b, in the column direction perpendicular to the row direction.

Therefore, according to the present invention, the semiconductor light emitting devices are not located at each intersection between the first and second electrodes, but arranged at a next intersection 1010b by skipping one intersection 1010a.

As illustrated in FIG. 5B, referring to a cross-section of a part A-A of FIG. 5A, it can be noticed that the semiconductor light emitting devices arranged on one first electrode 1020b are not electrically connected to the semiconductor light emitting devices arranged on one second electrode 1040b and are electrically connected to another second electrode 1040a which is neighboring to the one second electrode 1040b.

Meanwhile, as aforementioned, the semiconductor light emitting devices are spaced part from one another by the preset intervals.

Meanwhile, each of the second semiconductor light emitting devices 1050b-1 and 1050b-2 arranged along the second row 1000b is arranged between the neighboring semiconductor light emitting devices 1050a-1 therebetween, of the first semiconductor light emitting devices arranged along the first row 1000a.

Accordingly, the second semiconductor light emitting devices 1050b-1 and 1050b-2 and the neighboring first semiconductor light emitting devices 1050a-1 may form the triangular arrays.

In other words, the first semiconductor light emitting devices 1050a-1 arranged along the first row 1000a may be dislocated with respect to the semiconductor light emitting devices 1050b-1 and 1050b-2 arranged along the second row 1000b, in the column direction perpendicular to the row direction.

As illustrated, at least two second semiconductor light emitting devices 1050b-1 and 1050b-2 arranged on the second row 1000b and one neighboring first semiconductor light emitting device 1050a-1 arranged on the first row 1000a may form the triangular array, and accordingly the triangular region 1001 may be defined.

As described above, in a vehicle lamp (or car lamp) according to the present invention, semiconductor light emitting devices can be arranged in a manner that semiconductor light emitting devices arranged in neighboring rows form triangular arrays, thereby placing more semiconductor light emitting devices on an edge region of the vehicle lamp having various shapes. Therefore, brightness of the edge region of the vehicle lamp can be more improved. Also, in this instance, the semiconductor light emitting device can be arranged even on an edge region of a light source unit as many as possible. This may result in overcoming non-uniform brightness between the edge region and a central portion.

In addition, in the vehicle lamp according to the present invention, light emitted from the semiconductor light emitting devices arranged in the triangular arrays can uniformly be spread in all directions by proposing a ratio of length or width of the semiconductor light emitting devices optimized for the triangle array.

It should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A vehicle lamp comprising a light source unit to emit light,
   wherein the light source unit comprises:
      a wiring board; and
      a plurality of semiconductor light emitting devices electrically connected to the wiring board and arranged along a plurality of rows,
   wherein the plurality of semiconductor light emitting devices comprise:
      first semiconductor light emitting devices arranged at preset intervals along a first row of the plurality of rows; and
      second semiconductor light emitting devices arranged at the preset intervals along a second row neighboring to the first row,
   wherein each of the second semiconductor light emitting devices is disposed between neighboring first semiconductor light emitting devices of the first semiconductor light emitting devices so as to form triangular arrays with the first semiconductor light emitting devices,
   wherein each of the plurality of semiconductor light emitting devices includes a light emitting region in a rectangular shape, and
   wherein a length of one side of the light emitting region is longer than a length of another side by $3/2\sqrt{3}\pm0.5$ times.

2. The lamp of claim 1, wherein an interval between the first semiconductor light emitting devices arranged along the first row and the second semiconductor light emitting devices arranged along the second row are the same as the preset interval.

3. The lamp of claim 1, wherein the first semiconductor light emitting devices arranged along the first row are dislocated with respect to the second semiconductor light emitting devices arranged along the second row, in a column direction perpendicular to a row direction.

4. The lamp of claim 1, wherein the light source unit is divided into a plurality of triangular regions by the triangular arrays.

5. The lamp of claim 4, wherein the plurality of semiconductor light emitting devices are arranged on vertexes of the triangular regions, respectively.

6. The lamp of claim 5, wherein at least some of the triangular regions form an edge of the light source unit.

7. The lamp of claim 4, wherein the triangular regions sequentially form a triangular shape and an inverted triangular shape along a row direction.

8. The lamp of claim 1, wherein an edge of the wiring board is inclined in at least one of a row direction and a column direction perpendicular to the row direction.

9. The lamp of claim 8, wherein at least some of the plurality of semiconductor light emitting devices are sequentially arranged at the preset interval along the inclined edge of the wiring board.

10. The lamp of claim 8, wherein one side forming the edge of the wiring board forms an acute angle or an obtuse angle with another neighboring side.

11. The lamp of claim 1, wherein the light source unit is formed in a manner that at least part of an edge thereof is curved.

12. The lamp of claim 1, wherein the plurality of semiconductor light emitting devices are arranged such that an arranged interval in one of the row direction and the column direction is greater than an interval in another direction.

13. The lamp of claim 1, wherein a length of the light emitting region in a column direction is longer than a length in a row direction.

14. The lamp of claim 1, wherein each of the plurality of semiconductor light emitting devices comprises an n-type semiconductor layer, an active layer and a p-type semiconductor layer sequentially stacked on one another, and
   wherein the light emitting region corresponds to an area of the active layer.

* * * * *